(12) United States Patent
Haws et al.

(10) Patent No.: US 7,416,017 B2
(45) Date of Patent: Aug. 26, 2008

(54) METHOD AND APPARATUS FOR COOLING WITH A PHASE CHANGE MATERIAL AND HEAT PIPES

(75) Inventors: James L. Haws, McKinney, TX (US); Byron Elliott Short, Jr., Fairview, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/428,004

(22) Filed: Jun. 30, 2006

(65) Prior Publication Data

US 2006/0293086 A1 Dec. 28, 2006

Related U.S. Application Data

(63) Continuation of application No. 09/397,481, filed on Sep. 16, 1999, now Pat. No. 7,069,975.

(51) Int. Cl.
*F28D 20/00* (2006.01)
*F28D 15/02* (2006.01)

(52) U.S. Cl. ............... 165/10; 165/104.21; 165/104.33

(58) Field of Classification Search ............... None
See application file for complete search history.

(56) References Cited

U.S. PATENT DOCUMENTS

| | | | |
|---|---|---|---|
| 2,677,367 A | 5/1954 | Telkes | |
| 3,132,688 A | 5/1964 | Nowak | |
| 3,909,118 A | 9/1975 | Schmidt | |
| 4,047,198 A | 9/1977 | Sekhon et al. | |
| 4,099,853 A | 7/1978 | Glickler et al. | |
| 4,131,158 A * | 12/1978 | Abhat et al. ........... | 165/104.14 |
| 4,143,946 A | 3/1979 | Leo et al. | |
| 4,178,722 A | 12/1979 | Prusinski et al. | |
| 4,200,148 A | 4/1980 | Friefeld et al. | |

(Continued)

FOREIGN PATENT DOCUMENTS

EP 0 308 247 3/1989

(Continued)

OTHER PUBLICATIONS

Gaunt, et al., IBM Technical Disclosure Bulletin, XP 002045948, "Low Velocity Air-Jet Cooling," vol. 25, No. 7A, Dec. 1982, pp. 3305 and 3306.

(Continued)

*Primary Examiner*—Allen J Flanigan
(74) *Attorney, Agent, or Firm*—Baker Botts L.L.P.

(57) ABSTRACT

A cooling apparatus (10) includes a housing defined by two aluminum parts (12, 13) which are brazed to each other. A plurality of sector-shaped recesses (21-28) are provided within the housing, and collectively define a chamber having a plurality of ribs (41-48) extending therethrough. Each recess contains a sector-shaped piece of porous material (17, 18), which is brazed to surfaces of the housing parts. The remaining space within the chamber is filled with a phase change material. Each of the ribs has therein a respective radially extending opening (101-108) which contains a heat pipe (141). Expansion accumulators (151) are mounted on the housing, and communicate with the chamber therein, in order to accommodate expansion of the phase change material within the chamber as the phase change material is heated.

14 Claims, 5 Drawing Sheets

U.S. PATENT DOCUMENTS

| | | | |
|---|---|---|---|
| 4,250,958 A | 2/1981 | Wasserman | |
| 4,268,558 A | 5/1981 | Boardman | |
| 4,306,613 A | 12/1981 | Christopher | |
| 4,341,262 A | 7/1982 | Alspaugh | |
| 4,381,818 A | 5/1983 | Sachar et al. | |
| 4,408,659 A | 10/1983 | Hermanns et al. | |
| 4,446,916 A | 5/1984 | Hayes | |
| 4,494,171 A | 1/1985 | Bland et al. | |
| 4,512,388 A | 4/1985 | Claar et al. | |
| 4,528,208 A | 7/1985 | Hirvonen et al. | |
| 4,673,030 A | 6/1987 | Basiulis | |
| 4,730,233 A | 3/1988 | Osterman | |
| 4,823,863 A | 4/1989 | Nakajima et al. | |
| 4,832,118 A | 5/1989 | Scanion et al. | |
| 4,966,226 A | 10/1990 | Hamburgen | |
| 4,976,308 A | 12/1990 | Faghri | |
| 4,998,181 A | 3/1991 | Haws et al. | |
| 5,000,252 A * | 3/1991 | Faghri | 165/10 |
| 5,007,478 A | 4/1991 | Sengupta | |
| 5,039,577 A | 8/1991 | Knoell et al. | |
| 5,063,476 A | 11/1991 | Hamadah et al. | |
| 5,085,790 A | 2/1992 | Hormansdorfer | |
| 5,123,982 A | 6/1992 | Kuzay | |
| 5,128,689 A | 7/1992 | Wong et al. | |
| 5,225,964 A | 7/1993 | Nemes | |
| 5,263,536 A | 11/1993 | Hulburd et al. | |
| 5,267,611 A | 12/1993 | Rosenfeld | |
| 5,272,491 A | 12/1993 | Asakawa et al. | |
| 5,293,171 A | 3/1994 | Cherrette | |
| 5,325,913 A | 7/1994 | Altoz | |
| 5,386,701 A | 2/1995 | Cao | |
| 5,404,272 A | 4/1995 | Lebailly et al. | |
| 5,523,260 A | 6/1996 | Missele | |
| 5,579,830 A | 12/1996 | Giammaruti | |
| 5,697,428 A * | 12/1997 | Akachi | 165/104.21 |
| 5,852,548 A | 12/1998 | Koon et al. | |
| 6,148,906 A * | 11/2000 | Li et al. | 165/104.33 |
| 6,220,337 B1 * | 4/2001 | Chen et al. | 165/10 |

FOREIGN PATENT DOCUMENTS

| | | |
|---|---|---|
| EP | 0 541 456 A1 | 5/1993 |
| JP | 55-96892 | 7/1980 |
| JP | 60-232496 | 11/1985 |
| JP | 62248992 A * | 10/1987 |
| JP | 63-267890 | 11/1988 |
| JP | 1-147294 | 6/1989 |
| JP | 2-208497 | 8/1990 |
| JP | 4-44352 | 2/1992 |
| JP | 4-143526 | 5/1992 |
| JP | 6-34287 | 2/1994 |
| JP | 6-291480 | 10/1994 |

OTHER PUBLICATIONS

IBM Technical Disclosure Bulletin, XP 000584055, "Multi-Chip Module Impingement Cooling Plenum," vol. 39, No. 05, May 1996, pp. 57 and 58.

IBM Technical Disclosure Bulletin, XP 002045949, "IBM Packs In Hgih Density Circuits," Computer Design, Dec. 1984, pp. 254 and 255.

Rosenbaum, et al., "Efficient and Simple Heat Exchangers," 1981, pp. 593-594.

"Sketch A—Mechanical and Electrical Packaging of 'Slat' Phased Arrays," (1 sheet).

"Development of Advanced EHF Airborne Arrays," Ft. Monmouth, NJ, May 2, 1995 (13 sheets).

* cited by examiner

US 7,416,017 B2

METHOD AND APPARATUS FOR COOLING WITH A PHASE CHANGE MATERIAL AND HEAT PIPES

RELATED APPLICATIONS

This application is a continuation of U.S. application Ser. No. 09/397,481, filed Sep. 16, 1999 entitled "Method and Apparatus for Cooling with a Phase Change Material and Heat Pipes," now U.S. Pat. No. 7,069,975.

TECHNICAL FIELD OF THE INVENTION

This invention relates in general to a cooling apparatus and, more particularly, to a cooling apparatus containing a phase change material and suitable for use with a phased array antenna system.

BACKGROUND OF THE INVENTION

Phased array antenna systems are frequently used in satellites, for example to provide communication between a satellite and a ground station on the earth. As the satellite goes through its orbit, there are portions of the orbit in which the satellite antenna system can communicate with the ground station, and portions of the orbit in which the curvature of the earth prevents such communication. Consequently, the antenna system is operated during portions of the orbit, and is not operated during other portions of the orbit.

State of the art designs for phased array antenna systems include the use of miniature microwave integrated circuits (MMICs), positioned in close proximity to the antenna elements. The close proximity of the MMICs and antenna elements helps to reduce phase delays in radio frequency signals within the antenna system. On the other hand, the MMIC components generate a substantial amount of heat. If not properly cooled, this can interfere with antenna operation. In particular, temperature gradients across the antenna array must be minimized, because significant temperature gradients introduce phase errors into electrical radio frequency signals within the antenna system, which in turn leads to errors and/or inaccuracies during antenna operation.

In this regard, the maximum allowable temperature gradient across the array decreases as the operating speed of the array is increased. For example, when the phased array is operating at a frequency of about 5 GHz, the maximum allowable temperature gradient across the array is about 20° C. In contrast, when the array is operating at a frequency of about 80 GHz, the maximum allowable temperature gradient across the array is only about 1.3° C. If the maximum temperature gradient across the array cannot be kept within the appropriate limit, then it is necessary to provide additional circuitry in the antenna system, in order to effect dynamic phase error compensation control. Of course, this additional compensation circuitry increases the complexity, cost and weight of the phased array. Thus, it is desirable to have a cooling apparatus which is both efficient and effective.

Providing such a cooling apparatus in the specific environment of a satellite involves some relative stringent design criteria. The cooling apparatus must be relatively compact, and light in weight. Further, it must be highly reliable, and relatively maintenance free. One prior approach was to provide a cooling apparatus which included a housing with a chamber therein, the chamber containing both a phase change material and a thermally conductive porous material. Although such a cooling apparatus has been generally adequate for its intended purpose, it has not been satisfactory in all respects.

More specifically, it is not always possible to achieve cooling of a level sufficient to keep temperature gradients across the surface of an antenna system within a desired limit, particularly as operating frequencies increase. As a result, and as mentioned above, it can be necessary to provide special additional circuitry in the antenna system in order to effect dynamic phase compensation, thereby increasing the complexity, cost and weight of the antenna system. Further, with respect to antenna systems that are either large and/or high-power systems, the known cooling apparatus is not always capable of providing sufficiently efficient cooling to maintain junctions of the electrical devices at temperatures which are low enough to assure accurate and reliable operation. One result is a reduction in the accuracy and/or reliability of the overall antenna system.

SUMMARY OF THE INVENTION

From the foregoing, it may be appreciated that a need has arisen for a method and apparatus for providing effective and efficient cooling, with a cooling apparatus which is compact, lightweight and reliable, and which can consistently and accurately minimize temperature gradients across a device that is being cooled, while providing a greater cooling capacity than preexisting cooling devices. According to the present invention, a method and apparatus are provided to address this need, and involve: transferring heat to a housing which has therein a chamber that contains a heat absorbing material; distributing the heat within the heat absorbing material, including use of a heat pipe within the housing to facilitate distribution of the heat; and causing the heat absorbing material to absorb the heat.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
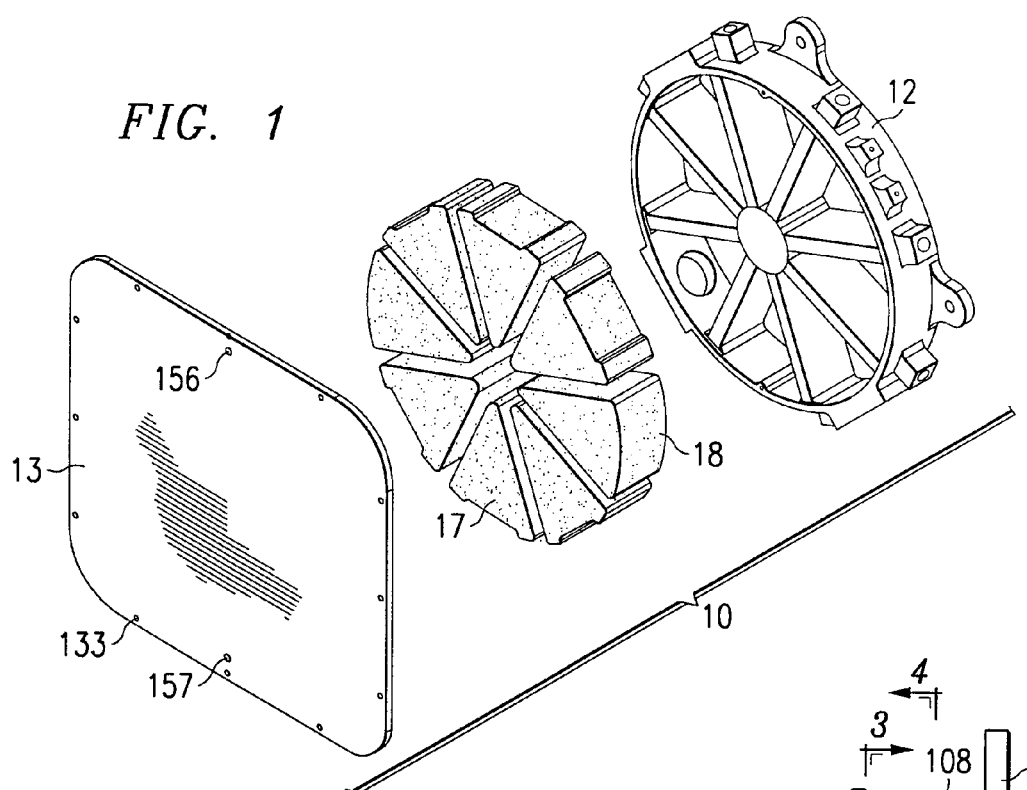
FIG. 1 is a diagrammatic exploded perspective view of a cooling apparatus which embodies the present invention.

FIG. 1 is a diagrammatic exploded perspective view of a cooling apparatus 10 which embodies the present invention. The cooling apparatus 10 includes a housing defined by two housing parts 12 and 13. The cooling apparatus 10 further includes a plurality of sector-shaped porous members disposed within the housing, two of which are identified at 17 and 18 in FIG. 1. The housing parts 12-13 and the porous parts 17-18 are all described in more detail later. The cooling apparatus 10 also includes a phase change material, which is disposed in the voids within the porous members 17-18, and is thus not separately visible in FIG. 1. The cooling apparatus 10 also includes three expansion accumulators, which are not depicted in FIG. 1, but which will be described in more detail later.

In the disclosed embodiment, the housing parts 12 and 13 are each made of a thermally conductive material. The thermally conductive material of the housing parts 12 and 13 is selected to have a coefficient of thermal expansion which substantially matches that of a system or device which is to be cooled by the cooling apparatus 10. In the disclosed embodiment, the housing parts 12 and 13 are each made of aluminum. However, other thermally conductive materials could alternatively be used, for example so that the housing has a coefficient of thermal expansion different from that of aluminum. For example, the housing parts could alternatively be made of aluminum silicon carbide (AlSiC).

Figure 2:
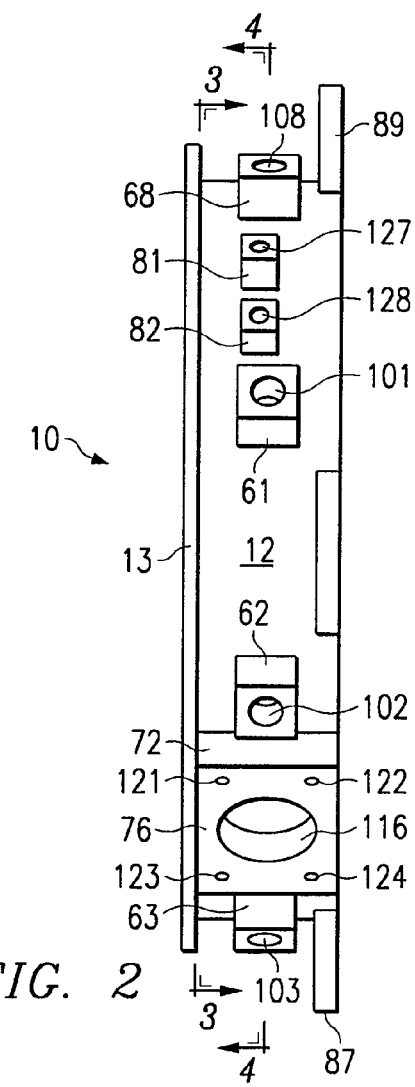
FIG. 2 is a diagrammatic side view of the cooling apparatus of FIG. 1, in a non-exploded configuration.
Figure 3:
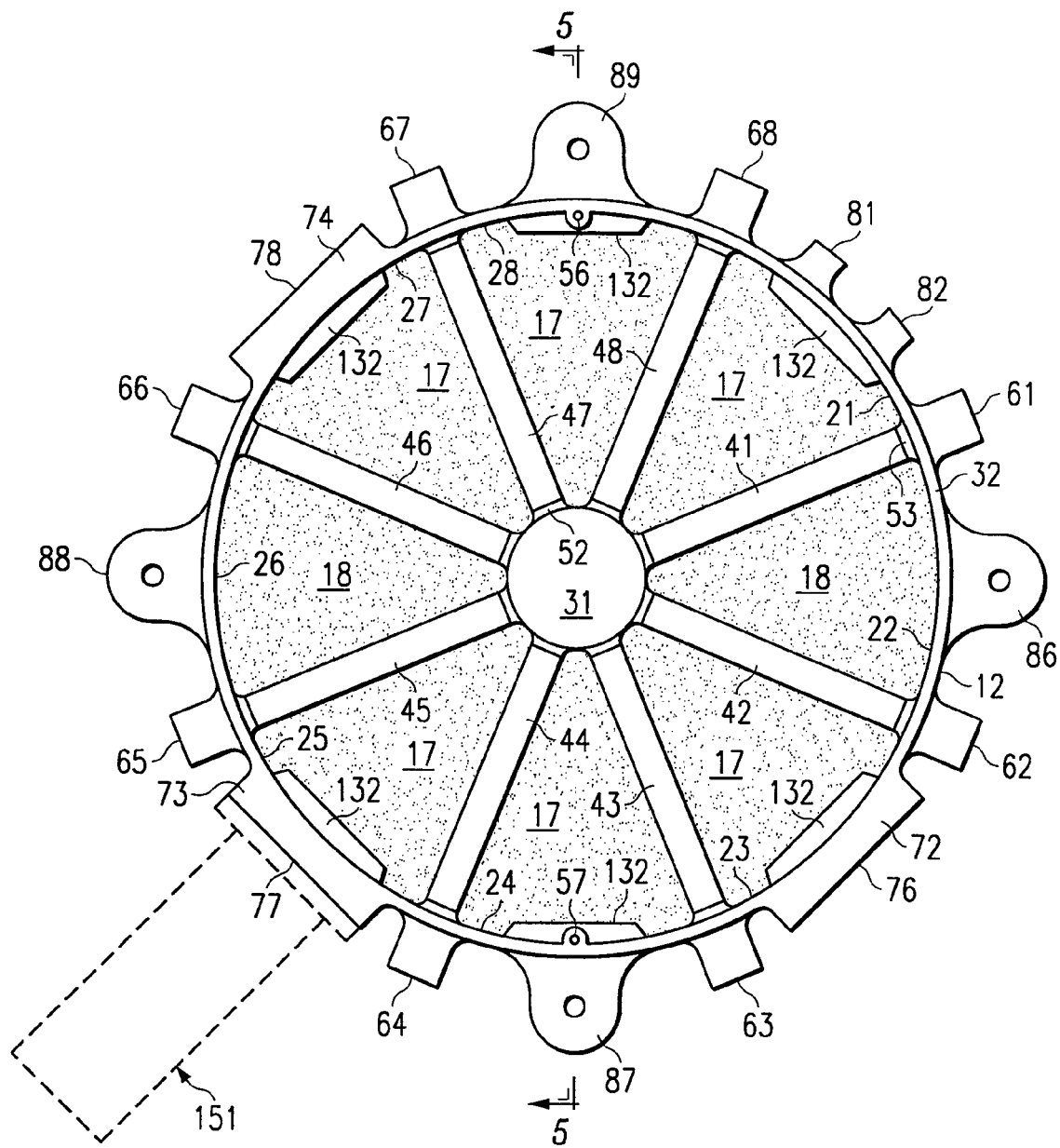
FIG. 3 is a sectional front view of the cooling apparatus, taken along the line 3-3 in FIG. 2.
Figure 4:
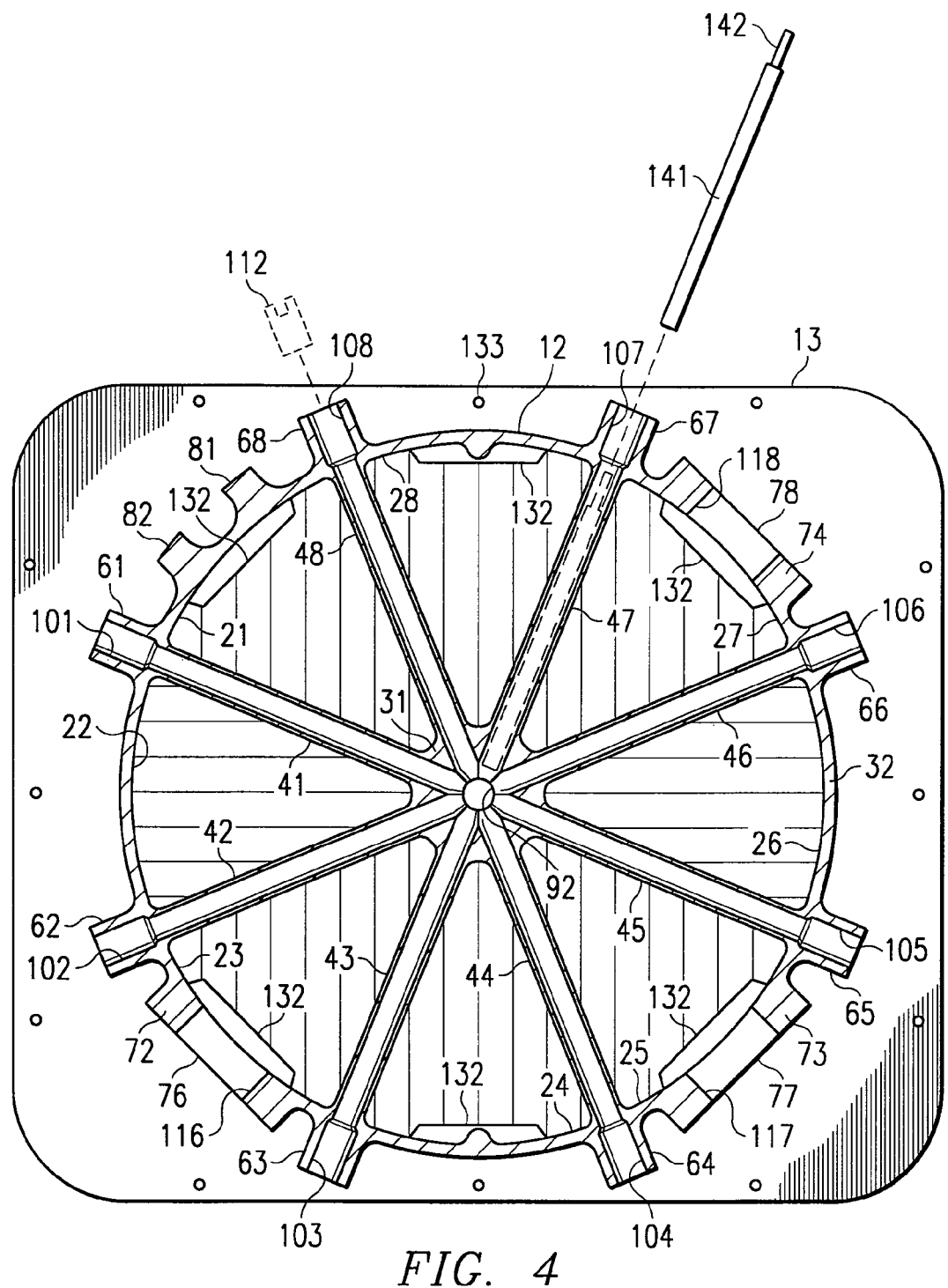
FIG. 4 is a sectional rear view of the cooling apparatus, taken along the line 4-4 in FIG. 2.

FIG. 2 is a side view of the cooling apparatus 10, in an assembled condition. FIGS. 3 and 4 are diagrammatic sectional front and rear views of the cooling apparatus 10, respectively taken along the section lines 3-3 and 4-4 in FIG. 2. FIG. 3 is, in effect, a view of the cooling apparatus 10 without the housing part 13.

Referring to FIG. 3, the housing part 12 is a single solid piece of aluminum having approximately the shape of a disk. The housing part 12 has eight sector-shaped recesses 21-28, which are machined into a side thereof that faces the housing part 13. The recesses 21-28 do not open through the opposite side of the housing. A cylindrical hub portion 31 is disposed coaxially in the center of the disk-shaped housing part 12, with the recesses 21-28 distributed circumferentially around the hub 31 at uniformly spaced intervals. The housing part 12 also has an annular rim portion 32 which extends circumferentially around the outside of the recesses 21-28. The housing part 12 further has eight ribs 41-48, which each extend radially outwardly from the hub 31 to the rim portion 32 between a respective pair of the recesses 21-28. Each of the ribs 41-48 has two grooves or channels 52-53, which are provided at opposite ends of the rib on the side thereof facing the housing part 13. The channels 52-53 provide fluid communication between a respective pair of the recesses 21-28, which are disposed on opposite sides of that particular rib. The groove 52 is provided in each rib at the radial end thereof adjacent the hub 31, and the groove 53 is provided in each rib at the radial end thereof adjacent the rim portion 32. The recesses 21-28 and the grooves 52-53 collectively define a chamber within the housing.

On the inner side of the rim portion 32, on diametrically opposite sides of the housing part 12, are two inwardly projecting, semi-cylindrical ridges, which each have therein an axially extending opening that receives a respective alignment pin 56 or 57. The alignment pins 56 and 57 are provided on the housing part 13, as described later.

On the outer side of the rim portion 32 are eight radially outwardly extending projections 61-68, each circumferentially aligned with a respective one of the ribs 41-48. The outer side of the rim portion 32 also has three outwardly-projecting bosses 72-74, the boss 72 being disposed between the projections 62 and 63, the boss 73 being disposed between the projections 64 and 65, and the boss 74 being disposed between the projections 66 and 67. The bosses 72-74 each have thereon a respective outwardly facing flat surface 76-78. Two protrusions 81 and 82 project radially outwardly from the rim portion 32, and are disposed between the projections 61 and 68. In addition, the rim portion 32 has four radially outwardly projecting tabs 86-89, which are spaced circumferentially at uniform intervals, and which each have an axial opening therethrough.

Figure 5:
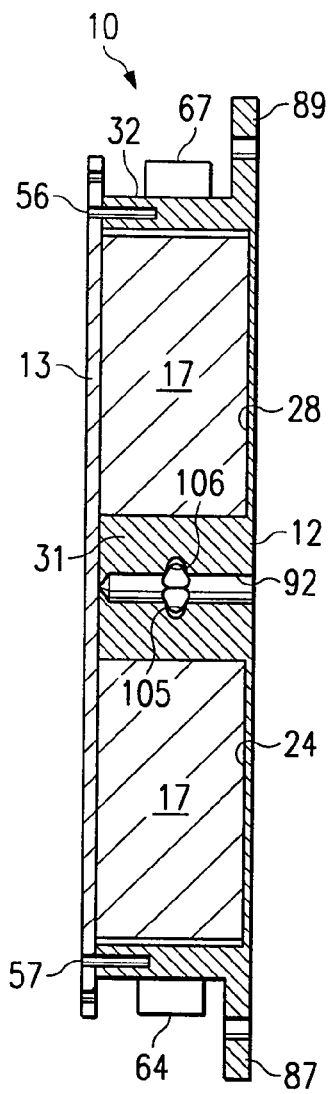
FIG. 5 is a sectional side view of the cooling apparatus, taken along the line 5-5 in FIG. 3.

FIG. 5 is a sectional side view taken along the line 5-5 in FIG. 3. Referring to FIGS. 4 and 5, a central axial passageway 92 extends coaxially into the cylindrical hub 31 from a side of the housing part 12 opposite from the housing part 13. The passageway 92 extends to a location near the housing part 13, but does not open through the side of the housing part 12 which faces the housing part 13.

Each of the radially-extending ribs 41-48 has extending therethrough a respective radial opening 101-108. The openings 101-108 each communicate at their radially inner end with the passageway 92, and each open through the a radially outer end of a respective one of the projections 61-68. A portion of each opening 101-108 which is within the associated projection 61-68 is of slightly greater diameter than the rest of that opening, and is internally threaded. A not-illustrated, threaded stud may be provided in the outer end of each of the openings 101-108, for example as shown at 112. However, the stud 112 is optional. The stud 112 is not present in the disclosed embodiment, and is therefore shown only in broken lines in FIG. 4.

With reference to FIGS. 2 and 4, three openings 116-118 each extend centrally through a respective one of the bosses 72-74, and also through the rim portion 32. The openings 116-118 each open through a respective one of the surfaces 76-78 provided at the outer ends of the bosses 72-74. Further, the openings 116-118 each open into a respective one of the recesses 23, 25 and 27, at a radially outer end of the recess. As best seen in FIG. 2, four threaded holes 121-124 are circumferentially distributed around each of the openings 116-118. The threaded holes 121-124 are blind holes, which do not communicate with the interior of the housing part 12. As best seen in FIG. 2, each of the protrusions 81-82 has a respective fill opening 127-128 extending radially therethrough, each of the fill openings 127-128 communicating at its radially inner end with the recess 21 in the housing part, and opening at its radially outer end through a surface on the radially outer end of the associated protrusion 81 or 82. The fill openings 127 and 128 are threaded, so that they may each be sealed by an appropriate bolt or stud, which is not illustrated. Alternatively, they may each be sealed by a press-in plug of a type known to those skilled in the art.

With reference to FIG. 3, the recesses 21, 23-25 and 27-28 each have therein a respective one of the sector-shaped porous members 17, and the recesses 22 and 26 each have therein a respective one of the sector-shaped porous members 18. The only difference between the porous members 17 and 18 is that the porous members 17 each have in the radially outer surface thereof a transverse groove 132 which is wide and shallow. As mentioned above, the porous members 17 and 18 are each made from an aluminum foam. In the disclosed embodiment, the effective volume occupied by each of the porous members 17 and 18 is 15% aluminum, and 85% void. A suitable material for the porous members 17 and 18 is commercially available from ERG Materials and Aerospace Corporation, Oakland, Calif., under the tradename DUOCEL. The porous members 17 and 18 are each of a size such that all outer surfaces thereof are in engagement with either the housing part 12 or the housing part 13, except that surfaces within the grooves 132 of the porous members 17 do not engage either of the housing parts.

As best seen in FIGS. 1 and 4, the housing part 13 is an aluminum plate. A plurality of openings 133 extend transversely through the housing part 13 at spaced locations along the peripheral edge thereof. Further, the housing part 13 includes the two above-mentioned alignment pins 56 and 57, which are disposed near opposite sides of the aluminum plate 13, which each have one end fixedly mounted in the plate 13, and which each project toward the housing part 12. In particular, as best seen in FIGS. 3 and 5, the pins 56 and 57 each extend into a respective opening provided in the ridges on the inner surfaces of the rim portion 32 of the housing part 12. In the disclosed embodiment, the housing parts 12 and 13 are vacuum brazed to each other, in order to sealingly secure the housing parts to each other. The pins 56 and 57 keep the housing parts 12 and 13 in alignment until they have been brazed to each other. During the brazing process, outer surfaces of each of the porous members 17 and 18 are brazed to surfaces of the housing, including surfaces on the metal plate 13, surfaces on the radially ribs 41-48, and the back surface of each of the recesses 21-28.

Each of the radial openings 101-108 has therein a respective heat pipe, one of which is shown at 141 in FIG. 4. Suitable heat pipes 141 are commercially available, one suitable example of which is the heat pipes commercially available from Dynatherm Corporation of Hunt Valley, Md., as Dynatherm 0476-1000. The heat pipes 141 in the disclosed embodiment each have a casing made of aluminum, and are filled with ammonia or pentane. FIG. 4 has broken lines which show the heat pipe 141 in its inserted position. The radially outer end of the heat pipe 141 is crimped at 142. The crimp 142 is an inherent part of the structure of the heat pipe 141 which is created during its manufacture, in particular to seal the heat pipe 141 after it has been filled.

Each of the ribs 41-48 in the disclosed embodiment has one radial opening 101-108 therethrough, and has one heat pipe 141 in the radial opening. However, it will be recognized that more than one radially opening and heat pipe could be provided in each of the ribs 41-48.

In the disclosed embodiment, each of the heat pipes 141 is secured in place within the associated opening 101-108 by a thermally conductive epoxy adhesive, which is not illustrated. In addition to holding the heat pipe 141 in place, the thermally conductive adhesive facilitates heat transfer between the casing of the heat pipe 141, and the associated aluminum rib 41-48 within which the heat pipe is disposed. For purposes of the disclosed embodiment, a suitable thermally conductive epoxy adhesive is a non-degassing or low degassing epoxy, such as MIL-A-46146 RTV coating available commercially from Dow Corning Corporation of Midland, Mich.

It is alternatively possible to substitute a known thermal grease for the thermally conductive epoxy. A suitable thermal grease is commercially available from Wakefield Engineering of Beverly, Mass., as Wakefield 120 thermal grease. In certain applications, for example in the vacuum of outer space, a thermal grease may have a tendency to flow or to evaporate. Therefore, the disclosed embodiment uses a thermally conductive epoxy adhesive, rather than a thermal grease. However, for some applications, a thermal grease may be satisfactory, because it has the advantage of permitting the heat pipes 141 to be extracted. In the event that a thermal grease is used instead of a thermally conductive epoxy adhesive, a respective threaded stud 112 would each be screwed into the outer end of each of the openings 101-108, in order to maintain the associated heat pipe 141 and its thermal grease in proper position.

The passageway 92 in the hub 31 of the housing part 12 permits air to escape from each of the openings 101-108 as the associated heat pipe 141 is inserted therein. The epoxy adhesive essentially establishes an airtight seal around the heat pipe 141 and, in the absence of the passageway 92, air at the inner end of each of the openings 101-108 would be trapped and compressed, and would thus tend to urge the heat pipe 141 radially outwardly, much like the piston of a hydraulic cylinder. Passageway 92 permits air to escape from the openings 101-108, in order to avoid this problem. Once the heat-pipes 141 have been installed, the passageway 92 is sealed in an appropriate manner. For example, the passageway 92 may be threaded, and a threaded stud (not illustrated) may be introduced into the passageway 92. Alternatively, a press-in plug of a type known to persons in the art may be inserted into the passageway 92.

Figure 6:
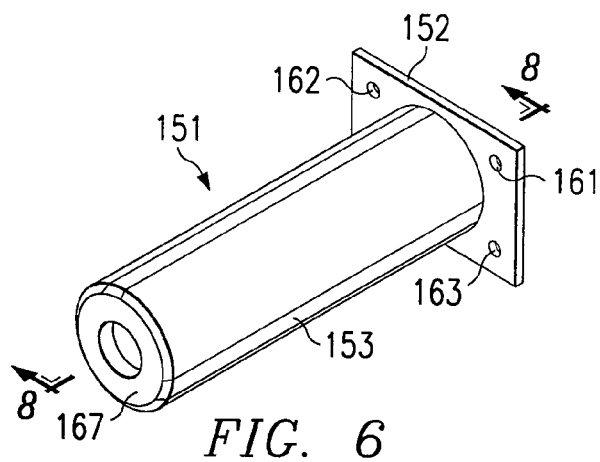
FIG. 6 is a perspective view of an expansion accumulator which is a component of the cooling apparatus of FIGS. 1-5.
Figure 7:
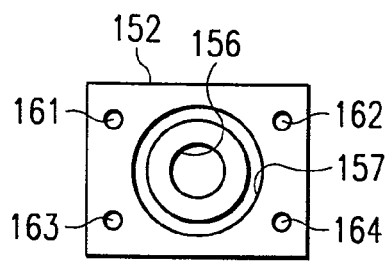
FIG. 7 is an end view of the expansion accumulator of FIG. 6.
Figure 8:
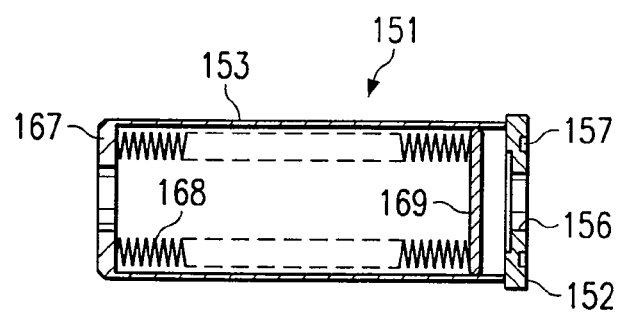
FIG. 8 is a diagrammatic sectional side view of the expansion accumulator of FIG. 6, taken along the line 8-8 in FIG. 6.

FIGS. 6-8 show an expansion accumulator 151, which is a commercially available device. The expansion accumulator 151 which is used in the disclosed embodiment may be obtained from EG&G of Daytona Beach, Fla., as part number 59450. The expansion accumulator 151 includes a rectangular plate 152, and a cylindrical tube 153 which extends perpendicular to and is secured to one side of the plate 152. Plate 152 has a central opening 156 therethrough, which communicates with the interior of the tube 153. The plate 152 has on a side thereof opposite from the tube 153 an annular groove 157, which extends concentrically around the opening 156. The groove 157 has therein a standard O-ring of silicon rubber, which has been omitted from FIGS. 7 and 8 for purposes of clarity. The plate 152 has four holes 161-164 therethrough, which are provided at circumferentially spaced locations around the opening 156.

With reference to FIGS. 6 and 8, the tube 153 includes at its end remote from the plate 152 a radially inwardly projecting annular flange 167. The expansion accumulator 151 includes, within the tube 153, a tubular bellows 168 which has one end sealingly coupled to the flange 167. A disk 169 is sealingly coupled to the opposite end of the bellows 168, and can move axially within the tube 153. The bellows expands and contracts as the disk 169 moves axially within the tube 153.

Three of the expansion accumulators 151 are secured to the housing part 12. In more detail, FIG. 3 has broken lines showing how one of the expansion accumulators 151 is coupled to the boss 73. In this regard, the plate 152 is disposed adjacent to the surface 77 on the boss 73. Four not-illustrated screws each extend through a respective one of the holes 161-164 in the plate, and threadedly engage a respective one of the threaded holes 121-124 provided in the boss 73. (FIG. 2). The not-illustrated O-ring provided in the annular groove 157 engages the surface 77 on the boss 73, in order to create a seal between the accumulator 151 and the housing part 12. The other two expansion accumulators 151 are secured to the bosses 72 and 74 in a similar manner.

As mentioned above, the housing 12-13 has therein a phase change material of a known type. More specifically, following assembly of the various components of the apparatus 10 which have been described above, the phase change material is introduced into the housing in a generally fluid form, through the fill openings 127 and 128 which are provided in the protrusions 81 and 82 of FIG. 2. As mentioned above, the recesses 21-28 and the channels 52-53 define a chamber within the housing, and about 15% of the overall space in the chamber is occupied by material of the porous members 17-18. Thus, as the phase change material is introduced through one or both of the fill openings 127-128, it flows through the recesses 21-28 and the channels 52-53, until it fills substantially all of the space within the recesses and channels other than that already occupied by the porous members 17-18. As this occurs, air from within the chamber escapes through the openings 127 and 128 as it is displaced by the phase change material. When substantially all of the air within the chamber has been replaced with a phase change material, the openings 127 and 128 are sealed, for example by inserting an appropriate threaded stud or screw.

The phase change material readily absorbs heat, but is not itself a good thermal conductor. Accordingly, the aluminum foam facilitates the distribution of heat within the phase change material disposed in the chamber of the housing. Suitable phase change materials are commercially available. In the disclosed embodiment, the phase change material is n-Dotriacontane (A-32-99), which includes $C_{16}H_{34}$, and can be commercially obtained from Humphrey Chemical Company of North Haven, Conn.

Figure 9:
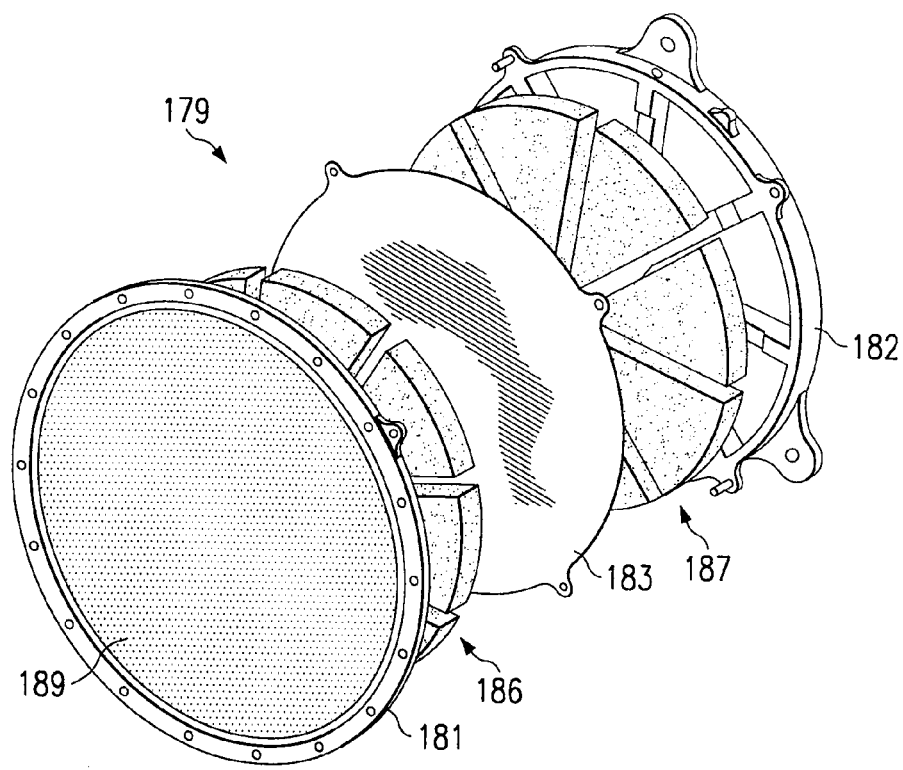
FIG. 9 is a diagrammatic exploded perspective view of the front of an antenna system which includes the cooling apparatus of FIGS. 1-8.
Figure 10:
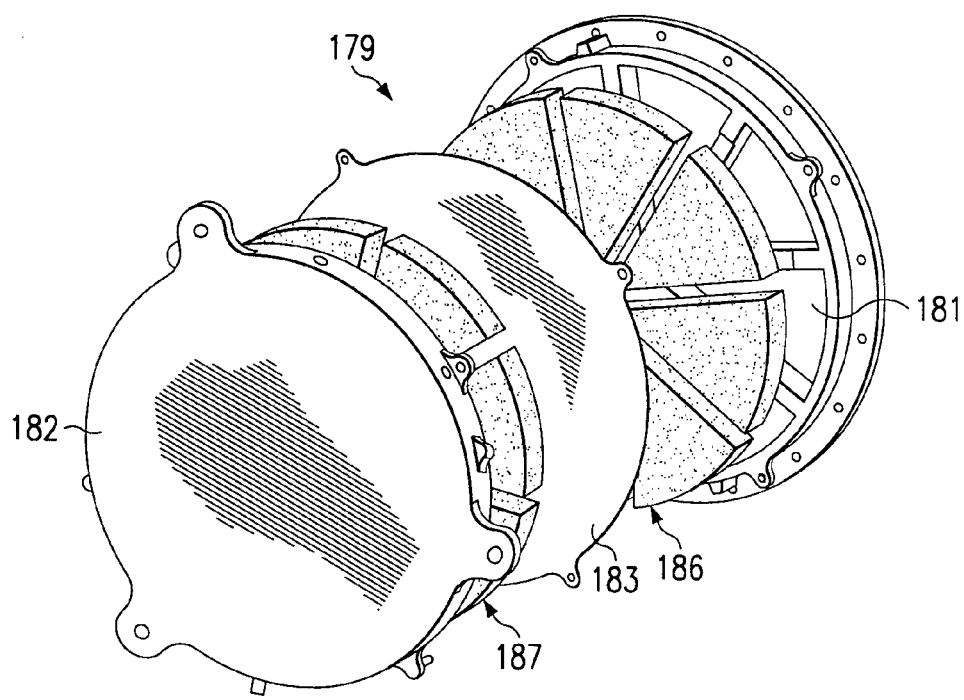
FIG. 10 is a diagrammatic exploded perspective view of the rear of the antenna system of FIG. 9.

FIGS. 9 and 10 are diagrammatic exploded perspective views of an antenna system 179 which includes two cooling systems of the type disclosed at 10 in FIGS. 1-8 and discussed above. More specifically, the antenna system 179 includes two housing parts 181 and 182, which are each similar in structure to the housing part 12. Further, the antenna system 179 has a single plate 183, which is disposed between and brazed to each of the housing parts 181-182, and which corresponds to the housing part 13 in the embodiment of FIGS. 1-8. A first set of porous members 186 is provided in the housing part 181, and a second set of porous members 187 is provided in the housing part 182. Aside from the fact that the plate 183 is shared between these two cooling systems, the cooling systems may each be effectively equivalent to the cooling apparatus 10 described above in association with FIGS. 1-8. A phased array antenna system 189 is mounted on the side of the housing part 181 opposite from the housing part 182. The antenna 189 includes a plurality of antenna elements, as well as not-illustrated circuit components that cooperate electrically with the antenna elements. The not-illustrated circuit components may include miniature microwave integrated circuits (MMICs), which generate a substantial amount of heat during operation. The dual cooling systems shown in FIGS. 9-10 are provided to absorb that heat during operation of the antenna system 179. For purposes of clarity, FIGS. 9 and 10 do not show all of the components of the two dual cooling systems. However, aside from the fact that a common plate 183 is shared between the two cooling systems, each of the cooling system may be effectively equivalent to the cooling apparatus 10 disclosed above in association with FIGS. 1-8.

The operation of the cooling apparatus 10 of FIGS. 1-8 is as follows. Heat is introduced into the cooling apparatus 10, typically by applying the heat to the surface of housing part 13 which is opposite from the housing part 12, or the surface of housing part 12 opposite from the housing part 13. Since the housing parts 12 and 13 are brazed to each other and to the porous members 17-18, and since these parts are all made of aluminum, the heat will tend to distribute itself within these parts. The heat pipes within the ribs 41-48 help facilitate a relatively uniform distribution of heat along each of the ribs.

Due to contact with the housing parts 12 and 13, and the porous members 17-18 therein, the phase change material within the housing absorbs the heat. In particular, as discussed above, the phase change material absorbs heat, but is not itself a particularly good thermal conductor. The porous members 17-18 facilitate distribution of heat throughout the phase change material, without requiring the heat to flow too far through the phase change material itself. As the phase change material absorbs heat, it changes phase.

The cooling apparatus 10 is intended for use in applications where heat is generated by the antenna system at intermittent intervals. For example, in a satellite, an antenna system cooled by the cooling apparatus 10 may only be able to operate during selected portions of the orbit, namely portions during which the antenna has a reasonably straight line of communication to a ground station. Thus, during certain portions of the orbit the antenna system generates heat which is absorbed by the cooling apparatus 10, and during other portions of the orbit, the antenna system is idle and the cooling apparatus 10 slowly discharges the heat which it previously absorbed.

If the phase change material continues to absorb heat after it changes phase, it will eventually begin to expand in volume. The cooling apparatus 10 is designed so that there should be little or no significant volumetric expansion to the phase change material under expected operating conditions. However, in unusual circumstances, it may be necessary for the cooling apparatus 10 to absorb more heat than it was normally designed to absorb. This is the reason why the three accumulators 151 are provided. In particular, if the cooling apparatus 10 absorbs sufficient heat that the phase change material begins to significantly expand in volume, then the phase change material can flow into the accumulators 151, in particular by pressing the disk 169 of each accumulator 151 radially outwardly, causing the associated tubular bellows 168 to compress. This avoids damage to the cooling apparatus 10, by avoiding a buildup of internal pressure. When the cooling apparatus 10 does eventually cool back down, the phase change material which flowed into the accumulators 151 will be urged back into the housing by the resilient forces of the tubular bellows 168.

Referring to FIG. 4, and as mentioned above, the porous members 17 in the recesses 21, 23, 25 and 27 each have therein a groove 132. The grooves 132 in these porous members facilitate flow of the phase change material through the openings 116-118, and through the fill openings 127-128. The porous members 17 in recesses 24 and 28 also have the grooves 132, but for the purpose of accommodating the semi-cylindrical ridges which are provided on the inner surface of the rim portion 32 of the housing. The porous members 18 in the recesses 22 and 26 do not have the grooves 132. This is to maximize the surface area of the porous members 18 which is in contact with the rim portion 32 of the housing part 12, and with the phase change material, in order to facilitate heat distribution within the housing and the phase change material.

The present invention provides a number of technical advantages. In particular, thermal gradients across the region cooled by the disclosed cooling system are minimized by structural features such as heat pipes. When the system is being used specifically to cool a phased array antenna system, the reduction in thermal gradients provides a reduction in phase errors in radio frequency signals within the antenna system, so that no dynamic phase compensation is required in the circuitry itself, which in turn reduces the complexity and cost of the circuitry of the antenna system. A further consideration is that the disclosed cooling system is compact and light in weight, and therefore highly suitable for use in applications such as a satellite, yet provides better cooling than previously known satellite cooling systems of comparable size and weight.

Another advantage is that the disclosed cooling apparatus can be positioned on the back side of a phased array antenna system, thus permitting the thermal design of the cooling system to be optimized independently of the electrical and radio frequency design of the antenna system. Yet another advantage is that the cooling apparatus is capable of cooling a higher level of heat dissipation than comparable preexisting systems, thereby avoiding excessive junction temperatures in cooled circuit devices, which in turn results in reduced failures and higher reliability of electrical components.

Although one embodiment has been illustrated and described in detail, it should be understood that various substitutions and alterations can be made therein without departing from the scope of the present invention. For example, in the disclosed embodiment, the radial ribs each include one heat pipe, but it would be possible to provide more heat pipes in each rib. A further example is that the heat pipes and their associated ribs are arranged to extend radially in the disclosed embodiment, but it would be possible to provide some other configuration of ribs and/or heat pipes. Yet another example is that the heat pipes in the disclosed embodiment are provided within ribs, but it would be possible to incorporate them into the housing in some other manner.

Still another example is that the chamber inside the disclosed housing is configured in the form of several portions or recesses which are substantially separate and communicate with each other through several channels, but the housing could be configured so that the ribs extend within the chamber without dividing it into substantially separate portions. As yet another example, the disclosed embodiment includes several expansion accumulators, but it would be possible use a different type of device to accommodate expansion, or to omit the expansion accumulators for certain applications. Other substitutions and alterations are also possible without departing from the spirit and scope of the present invention, as defined by the following claims.

What is claimed is:

1. An apparatus, comprising:
   a housing having a chamber therein, and having thereon an exterior surface through which heat can enter and leave said housing;
   a heat absorbing material disposed within said chamber in said housing;
   a heat pipe disposed completely within the chamber and disposed within the material of said housing and operative to facilitate heat distribution within the material of said housing in a manner which reduces temperature gradients across said surface; and
   wherein said housing has a thermally conductive portion with an opening therein, said opening being free of communication with said chamber, and wherein said heat pipe is disposed within said opening in said thermally conductive portion.

2. An apparatus according to claim 1, wherein said heat absorbing material is a phase change material.

3. An apparatus, comprising:
   a housing having a chamber therein, and having thereon an exterior surface through which heat can enter and leave said housing;
   a heat absorbing material disposed within said chamber in said housing;
   a heat pipe disposed completely within the chamber and disposed within the material of said housing and operative to facilitate heat distribution within the material of said housing in a manner which reduces temperature gradients across said surface; and
   a plurality of further heat pipes; wherein said housing includes a plurality of thermally conductive ribs extending within said chamber and each having therein an opening; and wherein each said opening has therein a respective one of said heat pipes, said further heat pipes each facilitating heat distribution within said housing in a manner which reduces temperature gradients across said surface.

4. An apparatus according to claim 3, wherein each said opening has a first end which communicates through a passageway in said housing with a location external to said housing.

5. An apparatus according to claim 3, wherein each said opening has a second end which is remote from said first end and which opens outwardly through an outer surface of said housing.

6. An apparatus, comprising:
   a housing having a chamber therein, and having thereon an exterior surface through which heat can enter and leave said housing;
   a heat absorbing material disposed within said chamber in said housing;
   means for distributing heat within the material of said housing in a manner which reduces temperature gradients across said surface, said means including a heat pipe disposed completely within the chamber and disposed within the material of said housing; and
   wherein said means includes said housing having a thermally conductive portion with an opening therein, said opening being free of communication with said chamber, and wherein said heat pipe is disposed within said opening in said thermally conductive portion.

7. An apparatus according to claim 6, wherein said heat absorbing material is a phase change material.

8. An apparatus according to claim 6, wherein said means includes a plurality of further heat pipes, and includes said housing having a plurality of thermally conductive ribs which each extend within said chamber and which each have therein an opening; and wherein each said opening has therein a respective one of said heat pipes.

9. An apparatus according to claim 8, wherein each said opening has a first end which communicates through a passageway in said housing with a location external to said housing.

10. An apparatus according to claim 9, wherein each said opening has a second end which is remote from said first end and which opens outwardly through an outer surface of said housing.

11. An apparatus according to claim 4, including an antenna system which engages said surface on said housing and which generates heat that is transferred through said surface to said housing.

12. An apparatus according to claim 4, including in said chamber within said heat absorbing material a thermally conductive member made of a porous material.

13. An apparatus according to claim 12, wherein said housing and said thermally conductive member are made of a metal, and wherein said thermally conductive member is brazed to surfaces of said housing which define said chamber.

14. An apparatus according to claim 12, wherein said heat absorbing material is a phase change material.

* * * * *

UNITED STATES PATENT AND TRADEMARK OFFICE
CERTIFICATE OF CORRECTION

PATENT NO. : 7,416,017 B2 Page 1 of 1
APPLICATION NO. : 11/428004
DATED : August 26, 2008
INVENTOR(S) : James L. Haws et al.

It is certified that error appears in the above-identified patent and that said Letters Patent is hereby corrected as shown below:

Column 10:
Line 47, after "An apparatus according to" delete "Claim 4" and insert -- Claim 6 --.

Line 51, after "An apparatus according to" delete "Claim 4" and insert -- Claim 6 --.

Signed and Sealed this

Sixth Day of January, 2009

JON W. DUDAS
*Director of the United States Patent and Trademark Office*